United States Patent
Hirano

(10) Patent No.: US 6,269,328 B1
(45) Date of Patent: Jul. 31, 2001

(54) TESTING INTEGRATED CIRCUIT DEVICE

(75) Inventor: Shin-ichi Hirano, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/083,608

(22) Filed: May 22, 1998

(30) Foreign Application Priority Data

May 26, 1997 (JP) .................................. 9-134878

(51) Int. Cl.[7] .............................. G06F 9/455; G06F 17/50
(52) U.S. Cl. ................................................ 703/28; 716/4
(58) Field of Search ...................... 395/500.03, 500.49; 716/4; 703/28

(56) References Cited

U.S. PATENT DOCUMENTS

| | | | |
|---|---|---|---|
| 4,525,789 | * 7/1985 | Kemper et al. | 702/117 |
| 4,556,806 | * 12/1985 | Amin | 326/80 |
| 4,791,356 | * 12/1988 | Warren et al. | 324/73.1 |
| 4,807,161 | * 2/1989 | Comfort et al. | 702/121 |
| 5,200,696 | * 4/1993 | Menis et al. | 324/158.1 |
| 5,430,400 | * 7/1995 | Herlein et al. | 327/108 |
| 5,440,522 | * 8/1995 | Hirano | 365/230.03 |
| 5,757,212 | * 5/1998 | Sevalia | 327/105 |

FOREIGN PATENT DOCUMENTS 6-311016  11/1994 (JP) .
WO 87/07054  * 11/1987 (WO) .

* cited by examiner

*Primary Examiner*—Kevin J. Teska
*Assistant Examiner*—Hugh Jones
(74) *Attorney, Agent, or Firm*—Ostrolenk, Faber, Gerb & Soffen, LLP

(57) ABSTRACT

A testing integrated circuit device comprises a plurality of external terminals for being connected to a circuit board, a plurality of internal terminals provided corresponding to the external terminals each of which is provided with a plurality of connection terminals including a signal terminal, and a plurality of signal terminal setting. corresponding to the internal terminals for setting characteristics of the signal terminals. The connection terminals are provided so that a desired one of the connection terminals in the internal terminal can be connected to the corresponding external terminal. Each of the signal terminal setting sections includes a first control circuit for arbitrarily setting whether the signal terminal is an input terminal or an output terminal, a second control circuit and a plurality of output buffers for arbitrarily setting an output driving ability of the signal terminal, and a third control circuit and a frequency demultiplier for arbitrarily setting the frequency of an output signal of the signal terminal. By the testing integrated circuit device, an LSI which is going to be installed on the circuit board can be simulated, and EMI noise, crosstalk, etc. of the circuit board on which the LSI will be installed can be evaluated, arbitrarily varying the characteristics of the external terminals.

4 Claims, 4 Drawing Sheets

SEE FIG.2

TESTING INTEGRATED CIRCUIT DEVICE

BACKGROUND OF THE INVENTION

The present invention relates to a testing integrated circuit device, and in particular, to a testing integrated circuit device which is installed on a circuit board in place of an integrated circuit device and is used for simulating the integrated circuit device in order to evaluate EMI noise, crosstalk, etc. of the circuit board on which the integrated circuit device will be installed.

DESCRIPTION OF THE RELATED ART

These days, the operating frequency of electronic devices is being made higher and higher, and according to the high speed operation, high-frequency noise emitted from electronic devices (hereafter referred to as EMI (Electro Magnetic Interference) noise) has become a problem which can not be neglected. The EMI noise is generated and emitted from almost all electronic devices. Therefore, efforts are being made by electronic device manufacturers to lower the EMI noise and bring it within specifications, by providing electromagnetic shielding to the electronic devices, frequency modulating the clock signals which are supplied to the electronic devices, etc.

FIG. 1 is a block diagram showing an example of a conventional method for preventing the EMI noise. Referring to FIG. 1, the frequency modulator modulates a clock signal which is supplied from the clock oscillator as shown in FIG. 2 and supplies the frequency modulated clock signal to the integrated circuit device. The frequency of the frequency modulated clock signal is varied periodically between the higher frequency A and the lower frequency B, thereby the absolute value of harmonics occurring in the integrated circuit device is reduced and the EMI noise emitted from the integrated circuit device is reduced.

At present, various kinds of LSIs (integrated circuit devices) are installed on a circuit board. However, users of the LSIs can not perform evaluation of the circuit board on which an LSI is installed, before the particular LSI is actually installed on the circuit board. In the evaluation of circuit boards, the EMI noise, crosstalk between lines on the circuit board, etc. are evaluated. For example, two signals which are simultaneously outputted from the LSI are supplied to two lines which are placed nearby on the user board, and interference between the two lines at a desired distance from the LSI is evaluated by checking signal waveforms.

However the above countermeasures against the EMI noise presently taken by electronic device manufacturers have the following drawbacks.

(1) Extra parts for frequency modulation are necessary and thus the prices of the integrated circuit devices get higher.

(2) EMI noise can be prevented by means of the frequency modulation, however it is difficult to take full advantage of performance of each parts of the integrated circuit device.

(3) EMI noise emitted from an electronic device can be prevented by means of electromagnetic shielding of the electronic device etc., however the EMI noise evaluation and the electromagnetic shielding can be done only after obtaining the LSI (integrated circuit device) which is the source of the EMI noise.

SUMMARY OF THE INVENTION

It is therefore the primary object of the present invention to provide a testing integrated circuit device which is installed on a circuit board in place of an LSI (or an integrated circuit device) in order to simulate the LSI before the LSI is produced or obtained, by which it is made possible to evaluate the EMI noise, crosstalk, etc. of the circuit board on which the LSI will be installed, and to determine appropriate terminal arrangement, driving ability, output signal frequency, etc. of external terminals of the LSI.

In accordance with a first aspect of the present invention, there is provided a testing integrated circuit device comprising a plurality of external terminals for being connected to a circuit board, a plurality of internal terminals provided corresponding to the external terminals each of which is provided with a plurality of connection terminals including a signal terminal, and a plurality of signal terminal setting means provided corresponding to the internal terminals for setting characteristics of the signal terminals. The connection terminals are provided so that a desired one of the connection terminals in the internal terminal can be connected to the corresponding external terminal. Each of the signal terminal setting means includes an input/output setting means for arbitrarily setting whether the signal terminal is an input terminal or an output terminal, an output driving ability setting means for arbitrarily setting output driving ability of the signal terminal, and an output signal frequency setting means for arbitrarily setting the frequency of an output signal of the signal terminal.

In accordance with a second aspect of the present invention, in the first aspect, the connection terminals of each of the internal terminals further include a power terminal for supplying power which is supplied from the circuit board to the testing integrated circuit device, and a ground terminal for connecting the ground of the testing integrated circuit device to the ground of the circuit board.

In accordance with a third aspect of the present invention, in the first aspect, the output signal frequency setting means includes a frequency multiplier/demultiplier for multiplying/demultiplying a clock signal supplied from the circuit board, and a third control circuit for setting the multiplying/demultiplying number of the frequency multiplier/demultiplier according to a signal which is supplied from outside the testing integrated circuit device. The output driving ability setting means includes a plurality of constant current sources each of which varies its output current according to the output of the frequency multiplier/demultiplier, and a second control circuit for selecting one or more constant current sources out of the constant current sources in the output driving ability setting means according to a signal which is supplied from outside the testing integrated circuit device and enabling the selected constant current sources to output signals to the signal terminal. And the input/output setting means includes a first control circuit which is provided with a function for totally disabling the constant current sources from outputting signals to the signal terminal according to a signal which is supplied from outside the testing integrated circuit device.

In accordance with a fourth aspect of the present invention, in the third aspect, the second control circuit sets the output driving ability of the signal terminal by varying the number of the selected constant current sources.

In accordance with a fifth aspect of the present invention, in the third aspect, the constant current sources are provided with different values of driving abilities, and the second control circuit sets the output driving ability of the signal terminal by selecting one constant current source according to the signal which is supplied from outside the testing integrated circuit device.

In accordance with a sixth aspect of the present invention, in the third aspect, the first control circuit and the second control circuit are realized by a logic decoder circuit for decoding data of a register which is set by the signal supplied from outside the testing integrated circuit device.

In accordance with a seventh aspect of the present invention, in the third aspect, the signal terminal setting means includes one or more registers provided to the first, second and the third control circuits, whose data are set by the signal supplied from outside the testing integrated circuit device. The registers provided to all of the signal terminal setting means are connected in series to form a shift register, and the operation of the first, second and the third control circuits is determined by setting the data of the registers by supplying the shift register with a serial signal as the signal supplied from outside the testing integrated circuit device.

In accordance with an eighth aspect of the present invention, in the first aspect, the connection terminals of each of the internal terminals further include a clock terminal for supplying a clock signal which is supplied from the circuit board to the testing integrated circuit device.

In accordance with a ninth aspect of the present invention, in the seventh aspect, the connection terminals of each of the internal terminals further include a serial clock terminal for supplying a serial clock signal to the registers provided to the signal terminal setting means in order to set the data to the registers.

In accordance with a tenth aspect of the present invention, in the seventh aspect, the connection terminals of each of the internal terminals further include a serial signal terminal for supplying the serial signal to the registers provided to the signal terminal setting means in order to set the data to the registers.

In accordance with an eleventh aspect of the present invention, in the first aspect, a plurality of power terminals for supplying power which is supplied from the circuit board to the testing integrated circuit device and a plurality of ground terminals for connecting the ground of the testing integrated circuit device to the ground of the circuit board are alternately provided to spaces between the internal terminals.

In accordance with a twelfth aspect of the present invention, in the third aspect, the constant current source is realized by a tri-state buffer.

BRIEF DESCRIPTION OF THE DRAWINGS

The objects and features of the present invention will become more apparent from the consideration of the following detailed description taken in conjunction with the accompanying drawings, in which.

DESCRIPTION OF THE PREFERRED EMBODIMENTS

Figure 1:
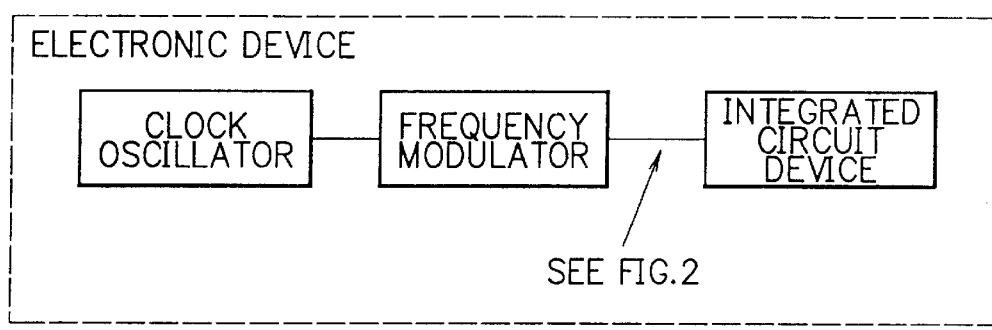
FIG. 1 is a block diagram showing an example of a conventional method for preventing EMI noise emitted from an electronic device.
Figure 2:
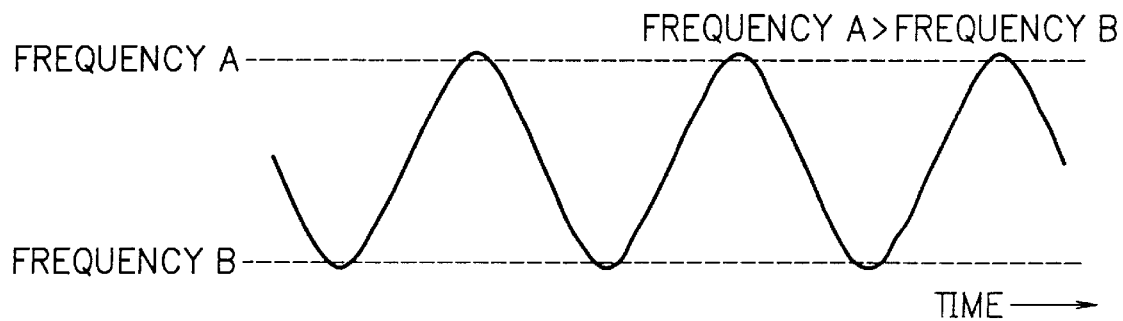
FIG. 2 is a schematic diagram showing modulation of a clock signal frequency performed by the frequency modulator shown in FIG. 1.

Referring now to the drawings, a description will be given in detail of preferred embodiments in accordance with the present invention.

Figure 3:
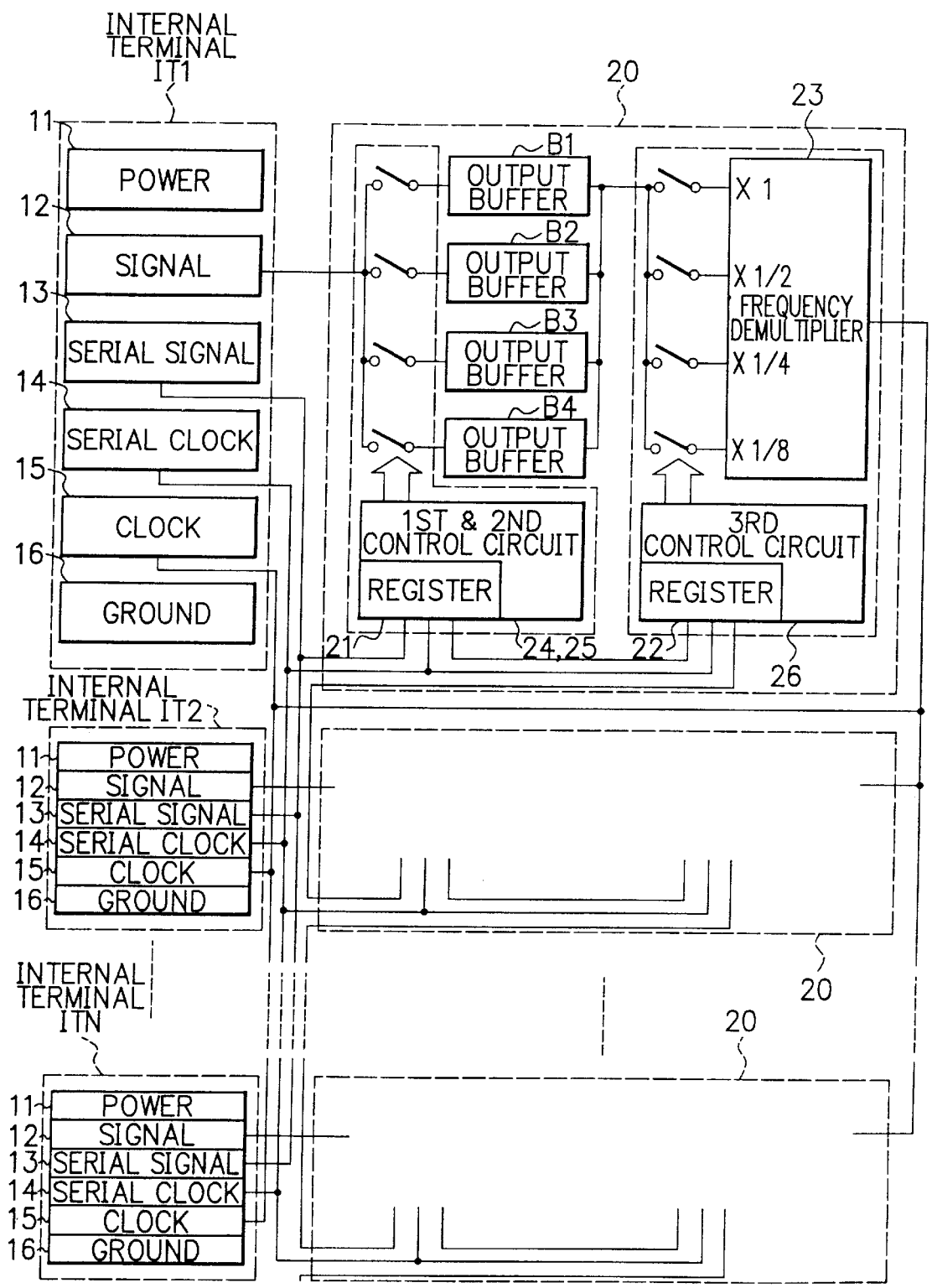
FIG. 3 is a block diagram showing the composition of a testing integrated circuit device according to the first embodiment of the present invention.

FIG. 3 is a block diagram showing composition of a testing integrated circuit device according to the first embodiment of the present invention.

Referring to FIG. 3, the testing integrated circuit device of the first embodiment is provided with N pieces of internal terminals IT1~ITN. The testing integrated circuit device is provided with N pieces of external terminals (external pins) ET1~ETN in the same way as ordinary integrated circuit devices such as LSIs, although not shown in FIG. 1. Each of the internal terminals IT1~ITN is provided corresponding to each of the external terminals ET1~ETN, respectively. The external terminals ET1~ETN are formed on the testing integrated circuit device in the same arrangement as external terminals of an integrated circuit device such as an LSI which the testing integrated circuit device is going to simulate, so that the testing of the integrated circuit device can be installed on the circuit board to be evaluated. Although the internal terminals IT1~ITN are arranged in a line in FIG. 3, they can be arranged in various types of patterns, such as a quadrangle, a matrix, etc., since the external terminals ET1~ETN and corresponding internal terminals IT1~ITN can be connected arbitrarily via internal wirings.

Each of the internal terminals IT1~ITN is provided with a plurality of connection terminals as shown in FIG. 3. The connection terminals include a power (feeding) terminal 11, a signal terminal 12, a serial signal terminal 13, a serial clock terminal 14, a clock terminal 15, and a ground terminal 16.

Further, N pieces of signal terminal setting sections 20 are provided to the testing integrated circuit device, corresponding to the signal terminals 12 of the internal terminals IT1~ITN. Each of the signal terminal setting sections 20 includes 4 pieces of output buffers B1~B4 for setting the output driving ability of the signal terminal 12, a frequency demultiplier 23 for setting the output frequency of the signal terminal 12, a register 21 for storing values concerning setting of the output buffers B1~B4, a register 22 for storing values concerning setting of the frequency demultiplier 23, a first control circuit 24 for setting whether the signal terminal 12 is an output terminal or an input terminal according to the values of the register 21, a second control circuit 25 for setting the output status of the output buffers B1~B4 to the signal terminal 12 according to the values of the register 21, and a third control circuit 26 for setting the demultiplying number of the frequency demultiplier 23 according to the values of the register 22.

The frequency demultiplier 23 is supplied with a clock signal which is supplied from the circuit board via one or more clock terminals 15 of one or more internal terminals. The output buffers B1~B4 are supplied with the output of the frequency demultiplier 23, and the output of the buffers B1~B4 controlled by the first and second control circuit are supplied to the signal terminal 12. The register 21 is at least a 3-bit register in order to control the four output buffers B1~B4 as will be described later, and the register 22 is at least a 2-bit register in order to set four different demultiplying numbers of the frequency demultiplier 23.

In FIG. 3, equivalent connection terminals in the N pieces of internal terminals IT1~ITN are connected together, except for the signal terminals. Concretely, the power terminals 11 in the N pieces of internal terminals IT1~ITN are connected together. In the same way, the serial signal terminals 13, the serial clock terminals 14, the clock terminals 15, and the ground terminals 16 in the N pieces of internal terminals IT1~ITN are also connected together, respectively.

Each of the power terminals 11 is connected to corresponding signal terminal setting section 20 in order to supply power to parts of the signal terminal setting section 20. Each of the serial clock terminals 14 is connected to the registers 21 and 22 in the corresponding signal terminal setting section 20 in order to supply a serial clock signal to the registers 21 and 22. Each of the clock terminals 15 is connected to the frequency demultiplier 23 of the corresponding signal terminal setting section 20 in order to supply the clock signal to the frequency demultiplier 23. Each of the ground terminals 16 is connected to the ground of the corresponding signal terminal setting section 20 in order to connect the ground of the signal terminal setting section 20 to the ground of the circuit board.

The registers 21 and the registers 22 in the N pieces of signal terminal setting sections 20 are connected in series so as to form a shift register. For example, in the case where the registers 21 are 3-bit registers and the registers 22 are 2-bit registers, the number of bits of the total shift register becomes 5×N. The serial signal terminals 13 in the N pieces of internal terminals are connected to the first stage of the shift register in order to supply a serial signal to the shift register, as shown in FIG. 3.

In this embodiment, the external terminals ET1~ETN and the connection terminals in the internal terminals IT1~ITN are connected according to a 'bonding option' designated by the user of the testing integrated circuit device. Each external terminal is bonded to one of the connection terminals in the corresponding internal terminal according to the bonding option. In other words, the user of the testing integrated circuit device can choose the functions of each external terminal out of 'power', 'signal', 'serial signal', 'serial clock', 'clock', and 'ground', by the bonding option.

For example, when an external terminal ETa is bonded to the power terminal 11 of the corresponding internal terminal ITa, the external terminal ETa thereafter becomes a power terminal of the testing integrated circuit device. When an external terminal ETb is bonded to the clock terminal 15 of the corresponding internal terminal ITb, the external terminal ETb thereafter becomes a clock terminal of the testing integrated circuit device. When an external terminal ETc is bonded to the signal terminal 12 of the corresponding internal terminal ITc, the external terminal ETc thereafter becomes an input signal terminal or an output signal terminal of the testing integrated circuit device. In an integrated circuit device such as an LSI, it is known that external terminals with high output signal frequency or high output driving ability largely contribute to the EMI noise. In the testing integrated circuit device according to the present invention, arrangement of input/output signal terminals can be arbitrarily set, and the output signal frequency and the output driving ability can be arbitrarily set to each of the output signal terminals.

Figure 4:
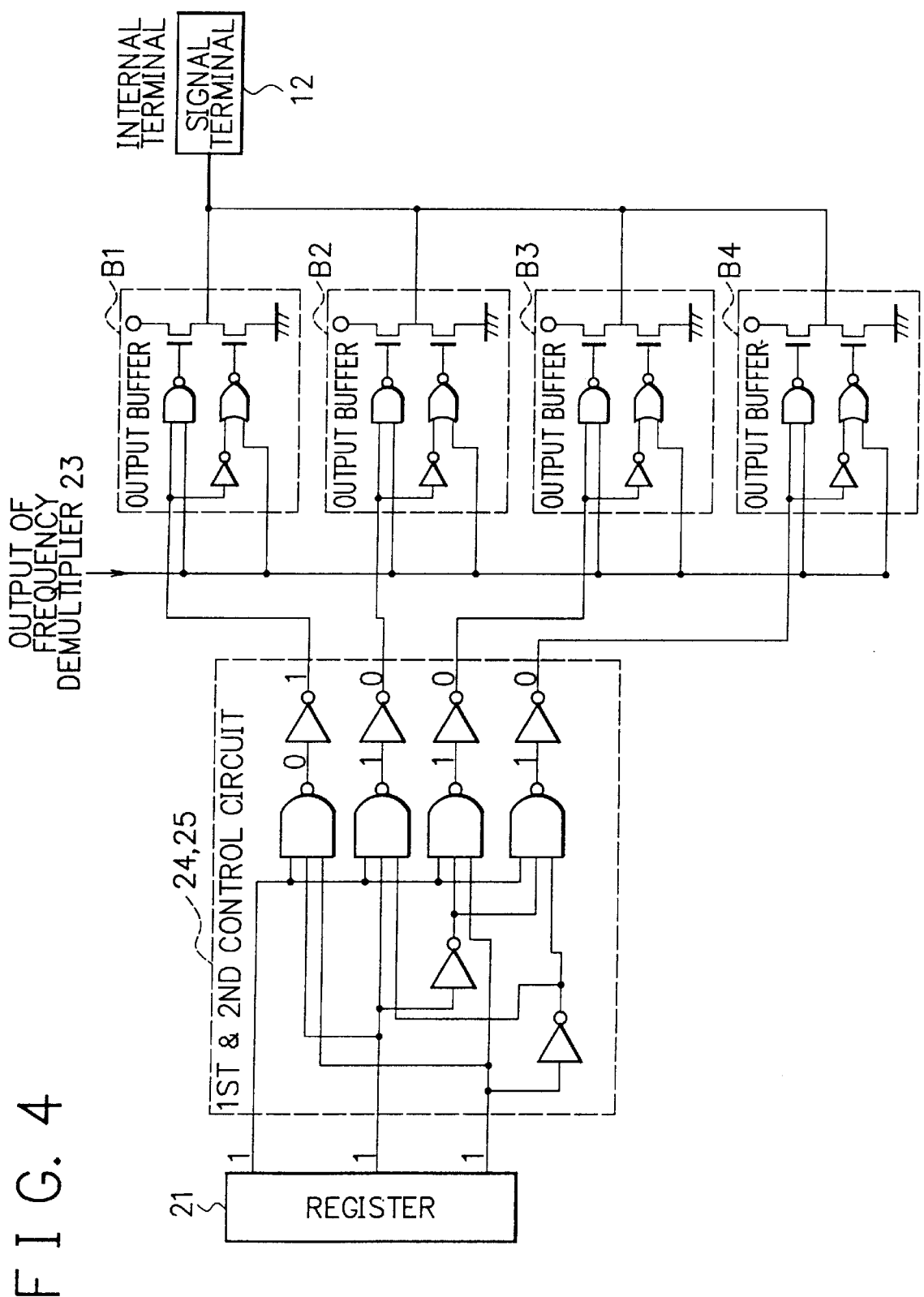
FIG. 4 is a block diagram showing an example of internal composition of the first and second control circuits and the output buffers shown in FIG. 3 and connection therebetween.

FIG. 4 is a block diagram showing an example of internal composition of the first and second control circuits 24 and 25 and the output buffers B1~B4, and connection of the register 21, the first and second control circuits 24 and 25, the output buffers B1~B4, the frequency demultiplier 23, and the signal terminal 12. The first and second control circuits 24 and 25 are realized by a logic decoder circuit composed of NAND gates and inverter gates. Each of the output buffers B1~B4 is a tri-state buffer. The first (upper in FIG. 4) bit of the register 21 is used for setting the first control circuit 24, and the latter (lower in FIG. 4) two bits of the register 21 is used for setting the second control circuit 25.

When the first bit is 0, the output of the logic decoder circuit becomes (0, 0, 0, 0) regardless of the values of the latter two bits, and thereby all of the output buffers B1~B4 are disabled and no signals are outputted from the output buffers B1~B4. By this setting, the signal terminal 12 can be set as a dummy input terminal.

When the first bit is 1, the output of the logic decoder circuit varies according to the values of the latter two bits. When the latter two bits are (1, 1) as shown in FIG. 4, the output of the logic decoder circuit becomes (1, 0, 0, 0), and thereby only the output buffer B1 is enabled. When the latter two bits are (1,0), the output of the logic decoder circuit becomes (0, 1, 0, 0), and thereby only the output buffer B2 is enabled. When the latter two bits are (0,1), the output of the logic decoder circuit becomes (0, 0, 1, 0), and thereby only the output buffer B3 is enabled. When the latter two bits are (0,0), the output of the logic decoder circuit becomes (0, 0, 0, 1), and thereby only the output buffer B4 is enabled.

The output buffers B1~B4, which are supplied with the output of the frequency demultiplier 23, are provided with different values of driving ability by varying the gate width/length of the transistors shown in FIG. 4. Therefore, by varying the latter two bits of the register 21 when the first bit is 1, the output driving ability of the signal terminal 12 can be varied, and thereby the output driving ability of the external terminal connected to the signal terminal 12 can be varied.

Incidentally, although different driving ability values were provided to the output buffers B1~B4 and the logic decoder circuit enabled only one output buffer in the above example, of course it is also possible to employ output buffers provided with the same driving ability values and a logic decoder circuit which varies the number of enabled output buffers according to the latter two bits. In addition, of course, the number of the output buffers for varying the output driving ability of the signal terminal 12 is not limited to 4.

In the following, the usage of the testing integrated circuit device of FIG. 3 will be explained.

First, each of the external terminals ET1~ETN is bonded to one of the connection terminals in the corresponding one of the internal terminals IT1~ITN, according to the bonding option of the user. At this point after the bonding, at least one external terminal has been connected to the power terminal 11, at least one external terminal has been connected to the ground terminal 16, one external terminal has been connected to the clock terminal 15, one external terminal has been connected to the serial signal terminal 13, one external terminal has been connected to the serial clock terminal 14, and the rest of the external terminals have been connected to the signal terminals 12, for example. In other words, the testing integrated circuit device now has at least one 'power' terminal, at least one 'ground' terminal, one 'clock' terminal, one 'serial signal' terminal, one 'serial clock' terminal, and 'signal' terminals, for example. The testing integrated circuit device to which the bonding has been performed is supplied to the user.

Subsequently, the user installs the testing integrated circuit device on a circuit board. The user then performs setting of the signal terminal setting sections 20 corresponding to each of the external terminals ET1~ETN. The serial clock signal is supplied to the 'serial clock' terminal and the serial signal is supplied to the 'serial signal' terminal. The serial signal goes through the aforementioned shift register (5×N bits, for example) according to the supply of edges of the serial clock signal, and eventually, values represented by the serial signal are set in all of the registers 21 and 22. After the setting of the registers 21 and 22, the supply of the serial clock signal is stopped in order to fix the values of the registers 21 and 22.

By the serial signal, the register 21 and the register 22 in each signal terminal setting section 20 are set as follows. If an external terminal corresponding to the signal terminal setting section 20 has been set as a 'signal' terminal which receives signals (i.e. an 'input signal' terminal), the register 21 is set so as to disable all of the output buffers B1~B4 (In the case of FIG. 4, the register 21 is set (0, *, *).). If corresponding external terminal has been set as a 'signal' terminal which outputs signals (i.e. an 'output signal' terminal), the register 21 is set so that one or more of the output buffers B1~B4 will be enabled to have desired driving ability (In the case of FIG. 4, the register 21 is set (1, *, *).), and so that the frequency demultiplier 23 will be set at a desired demultiplying number. If a corresponding external terminal has been set as a terminal other than a 'signal' terminal, it is preferable that the register 21 is set so as to disable all of the output buffers B1~B4 (In the case of FIG. 4, the register 21 is set (0, *, *).)

By the bonding according to the bonding option of the user and the setting of the signal terminal setting sections 20 described above, each of the external terminals ET1~ETN has been provided with a particular function chosen from 'input signal', 'output signal', 'power', 'ground', 'clock', 'serial signal', and 'serial clock', and for each of the 'output signal' terminals, the demultiplying number of the frequency demultiplier 23 and the driving ability (i.e. the output signal frequency and the output driving ability of the 'output signal' terminal) have been set.

By the testing integrated circuit device, the user can perform evaluation of the EMI noise, crosstalk, etc. of the circuit board on which the LSI will be installed, arbitrarily varying the setting of the signal terminal setting sections 20 using the serial signal. Further, the user can determine appropriate arrangement of input/output signal terminals, power terminals, etc., and appropriate driving ability, output signal frequency, etc. of signal terminals of the LSI which the testing integrated circuit device is simulating, according to the evaluation of the EMI noise, crosstalk, etc.

Incidentally, a technique for varying driving ability of output signal terminals has been disclosed in Japanese Patent Application Laid-Open No.HE16-311016. However, simulation of external terminals of LSIs and evaluation/analysis of EMI noise can not be realized by such a single function for switching driving ability of output signal terminals.

Furthermore, manufacturers of electronic devices can evaluate/analyze effects' of arrangement of input/output terminals in an electronic device, operating frequency and driving ability of output terminals, etc. on the EMI noise, crosstalk, etc., even if LSIs necessary for the electronic device have not been produced or obtained. Therefore, electronic device manufacturers can previously examine and study countermeasures against EMI noise, crosstalk, etc., which are most effective to a particular electronic device, and produce the LSIs or the electronic device considering the result of the study.

Figure 5:
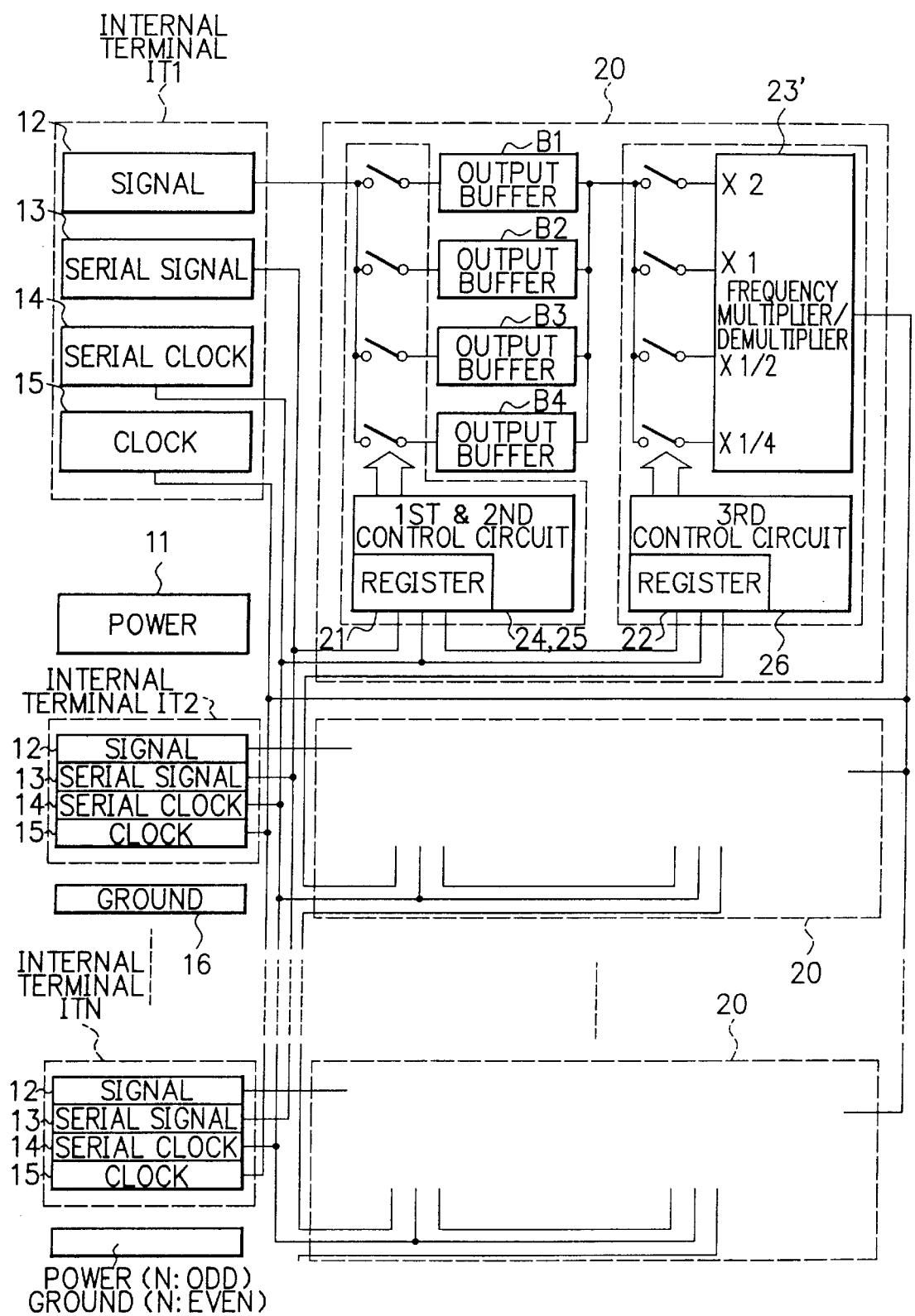
FIG. 5 is a block diagram showing the composition of a testing integrated circuit device according to the second embodiment of the present invention.

FIG. 5 is a block diagram showing composition of a testing integrated circuit device according to the second embodiment of the present invention.

Referring to FIG. 5, the composition of the testing integrated circuit device of the second embodiment is basically the same as that of the first embodiment, except that the power terminals 11 and the ground terminals 16 are alternately provided to spaces between the internal terminals IT1~ITN, instead of providing them to each internal terminal. The power terminals 11 in FIG. 5 are connected together and connected to the signal terminal setting sections 20 in order to supply power to parts of the signal terminal setting sections 20. The ground terminals 16 in FIG. 5 are connected together and connected to the signal terminal setting sections 20 in order to connect the ground of the signal terminal setting sections 20 to the ground of the circuit board. Further, each signal terminal setting section 20 is provided with a frequency multiplier/demultiplier 23' instead of the frequency demultiplier 23 of FIG. 3.

By the composition of FIG. 5, the number of power terminals 11 and the ground terminals 16 can be reduced, and the space for terminals in the testing integrated circuit device can be saved. Further, by the frequency multiplier/demultiplier 23', evaluation of the EMI noise, crosstalk, etc. of the circuit board can be executed with higher and wider output signal frequency range of the 'output signal' terminals.

The other features are basically the same as those of the first embodiment, and thus repeated description thereof is omitted for brevity.

Incidentally, although the output buffers B1~B4 have been employed in the signal terminal setting section 20 in order to set the output driving ability of the signal terminal 12 in the above embodiments, of course it is also possible to employ other types of constant current sources for setting the output driving ability of the signal terminal 12.

In addition, although the serial signal terminal 13 and the serial clock terminal 14 were provided to each of the internal terminals IT1~ITN and at least two of the external terminals ET1~ETN were used to be connected to the serial signal terminal 13 and the serial clock terminal 14 in the above embodiments, there are cases where the integrated circuit device such as an LSI which the testing integrated circuit device is simulating does not have terminals for receiving serial signals or serial clock signals. In such cases, it is very difficult to fully simulate all of the input/output signal terminals of the LSI having N pins by the testing integrated circuit device of the above embodiments having N pins. However, in some types of packages, it is also possible to provide a serial signal terminal and a serial clock terminal, for example, on the upper surface etc. of the testing integrated circuit device, without providing the serial signal terminal 13 and the serial clock terminal 14 to each of the internal terminals IT1~ITN and using two external terminals for being connected to them. By such composition, complete simulation of all of the input/output signal terminals of the LSI can be realized.

In addition, although the testing integrated circuit device to which the bonding according to the bonding option of the user has been performed was supplied to the user in the above embodiments, it is also possible to employ a composition of the testing integrated circuit device by which the user can perform the bonding between the external terminals and the connection terminals after the supply of the testing integrated circuit device.

As set forth hereinabove, in the testing integrated circuit device according to the present invention, internal terminals are provided corresponding to the external terminals of the testing integrated circuit device. Each internal terminal is provided with a plurality of connection terminals including a signal terminal. A signal terminal setting means is provided corresponding to the internal terminals in order to set the characteristics of the signal terminals. The connection terminals are provided so that a desired one of the connection terminals in the internal terminal can be connected to a corresponding external terminal. Each of the signal terminal setting means includes an input/output setting means for arbitrarily setting whether the signal terminal is an input terminal or an output terminal, an output driving ability setting means for arbitrarily setting an output driving ability of the signal terminal, and an output signal frequency setting means for arbitrarily setting the frequency of an output signal of the signal terminal.

By the testing integrated circuit device, it is possible to simulate an integrated circuit device such as an LSI which is going to be installed on a circuit board, by arbitrarily varying functions (power, ground, input signal, output signal, clock, serial signal, serial clock, etc.) of the external terminals of the testing integrated circuit device and by arbitrarily varying the characteristics (input/output, output signal frequency, output driving ability, etc.) of the signal terminals of the testing integrated circuit device. Therefore, evaluation of EMI noise, crosstalk, etc. of the circuit board on which the LSI will be installed can be evaluated, by arbitrarily varying the characteristics of the signal terminals.

Further, appropriate arrangement of signal terminals, power terminals, etc., and appropriate driving ability, output signal frequency, etc. of signal terminals of the LSI which the testing integrated circuit device is simulating can be determined, according to the evaluation of the EMI noise, crosstalk, etc.

Furthermore, manufacturers of electronic devices can evaluate/analyze effects of arrangement of input/output terminals in an electronic device, operating frequency and driving ability of output terminals, etc. on EMI noise, crosstalk, etc., even if LSIs necessary for the electronic device have not been produced or obtained. Therefore, electronic device manufacturers can previously examine and study countermeasures against EMI noise, crosstalk, etc., which are most effective to a particular electronic device, and produce the LSIs or the electronic device considering the result of the study.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A testing integrated circuit device for simulating a circuit on a circuit board, said testing integrated device comprising:
   a plurality of external terminals effective to be connected to said circuit board;
   a plurality of internal terminals each coupled to a corresponding external terminal each of said internal terminals having at least one connection terminal including a signal terminal;
   said connection terminals being arranged so that a desired one of said connection terminals in a corresponding internal terminal can be connected to a corresponding external terminal;
   a first, second, and third control circuit coupled to each internal terminal;
   wherein:
   said first control circuit dictates whether a corresponding signal terminal is to function as an input terminal or an output terminal:
   said second control circuit dictates an output driving ability of said corresponding signal terminal when said corresponding signal terminal functions as an output terminal; and
   said third control circuit dictates a frequency of an output signal output from said corresponding signal terminal when said corresponding signal terminal functions as an output terminal;
   said third control circuit includes:
   a frequency Multiplier/demultiplier for multipling/demultiplying a clock signal supplied from said circuit board, wherein said third control circuit controls said frequency multiplier/demultiplier in response to a control signal which is supplied from outside said testing integrated circuit device; and
   said second control circuit includes:
   a plurality of constant current sources, each of said constant current sources produces an output current with a frequency defined by an output of said frequency multiplier/demultiplier; wherein said second control circuit selects and enables at least one of said constant current sources in response to said control signal; and
   first control circuit selectively disables all of said constant current sources from outputting signals to said signal terminal, in response to said control signal supplied from outside said testing integrated circuit device; and
   at least one register coupled to said first, second and the third control circuits; and wherein:
   said at least one register receives data from said control signal;
   all registers are connected in series to form a shift register; and
   said control signal is a serial signal.

2. A testing integrated circuit device as claimed in claim 1, wherein said connection terminals further include a serial clock terminal which supplies a serial clock signal to said registers as said control signal.

3. A testing integrated circuit device as claimed in claim 1, wherein said connection terminals further include a serial signal terminal which supplies a serial signal as said control signal to said registers.

4. A testing integrated circuit device as claimed in claim 1, wherein each constant current source is realized by a tri-state buffer.

* * * * *